United States Patent
Holbrook et al.

(10) Patent No.: US 6,821,713 B1
(45) Date of Patent: Nov. 23, 2004

(54) METHOD FOR LATERAL TRIMMING OF SPACERS

(75) Inventors: Allison Holbrook, San Jose, CA (US); Jiahua Huang, San Jose, CA (US); Sunny Cherian, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 95 days.

(21) Appl. No.: 10/085,242

(22) Filed: Feb. 27, 2002

(51) Int. Cl.$^7$ .................................................. G03F 7/26
(52) U.S. Cl. ...................... 430/313; 430/311; 438/595
(58) Field of Search ................................. 430/311, 313, 430/329; 438/308, 595, 695

(56) References Cited

U.S. PATENT DOCUMENTS

| | | | |
|---|---|---|---|
| 6,268,253 B1 | 7/2001 | Yu | 438/303 |
| 6,492,275 B2 * | 12/2002 | Riley et al. | 438/696 |

* cited by examiner

*Primary Examiner*—Kathleen Duda
(74) *Attorney, Agent, or Firm*—Farjami & Farjami LLP

(57) ABSTRACT

Spacer etch trim techniques are provided. The method controllably trims a multi-film stack spacer utilizing a self-limiting etch technique. The method may use a dry etch etcher with low bias power. The dry etch process may also use other modified parameters, such as gas flows and various pressures.

29 Claims, 6 Drawing Sheets

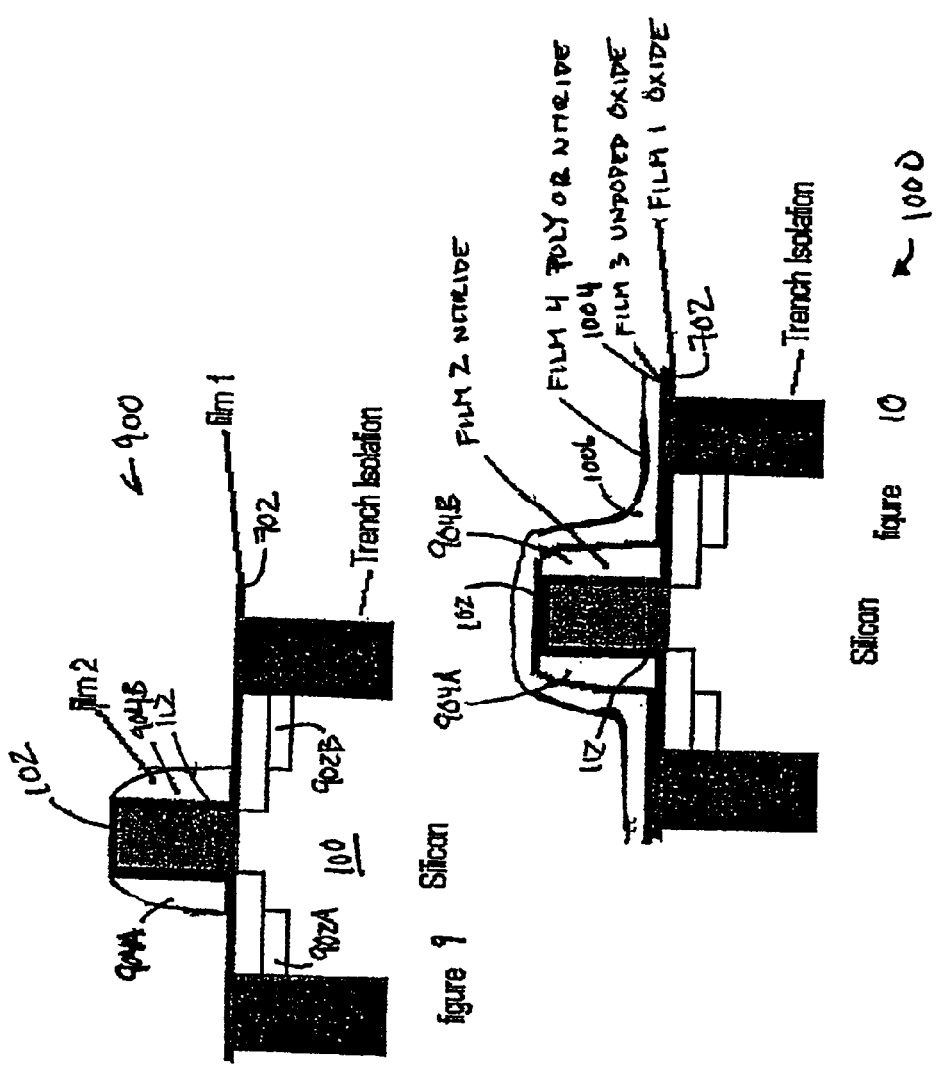

METHOD FOR LATERAL TRIMMING OF SPACERS

Co-assigned U.S. patent application Ser. No. 10/086,126 entitled "IMPLANT PROFILES AND ACTIVE AREA MODULATION USING SPACER ETCH TRIM TECHNIQUES" filed on Feb. 27, 2002, is hereby incorporated by reference in its entirety.

BACKGROUND OF THE INVENTION

1. Field of the Invention

The present invention relates to semiconductor fabrication, and in particular, to ting spacers that are formed along the sidewalls of a semiconductor gate structure.

2. Description of the Related Art

Traditional semiconductor spacers are formed along the sidewalls of a transistor device using various materials, such as oxide, polysilicon and nitrides.

SUMMARY OF THE INVENTION

Methods for lateral trimming of spacers are provided in accordance with the present invention. A method in accordance with the invention may regulate and repeatably trim a nitride or polysilicon spacer. In one embodiment, the method controllably trims a multi-film stack spacer utilizing a "self-limiting" etch technique. Modulating the width of a spacer during a process flow can improve device performance by allowing additional source and drain to be implanted during the process and increased source and drain area dimensions.

In one embodiment, the method uses a plasma dry etch process that advantageously controls the ratio of lateral-to-vertical etch rates in spacer etch trimming. The etching technique is predominantly chemical in nature and enhances lateral trim capabilities.

One aspect of the invention relates to a method of forming spacers proximate to a gate structure. The method comprises forming a first layer over a gate structure and a substrate; etching the first layer to form a first set of spacers proximate to the gate structure; forming a second layer over the substrate, the first set of spacers and the gate structure; forming a third layer over the second layer; etching the third layer to form a second set of spacers proximate to the first set of spacers; and dry etching the second set of spacers with a plasma, wherein the second layer prevents the etching of the second set of spacers from substantially affecting the first set of spacers.

Another aspect of the invention relates to a transistor structure formed by the method described above.

Another aspect of the invention relates to a system configured to form a first AU layer over a gate structure and a substrate; etch the first layer to form a first set of spacers proximate to the gate structure; form a second layer over the substrate, the first set of spacers and the gate structure; form a third layer over the second layer; etch the third layer to form a second set of spacers proximate to the first set of spacers; and etch the second set of spacers, wherein the second layer prevents the etching of the ill second set of spacers from substantially affecting the first set of spacers.

BRIEF DESCRIPTION OF THE DRAWINGS

FIG. 9 shows the nitride layer of FIG. 8 etched to form spacers and also shows additional source and drain implants, which may be formed by doping, for example, to tune the device for desired performance.

FIG. 10 shows the first pair of spacers from FIG. 9, an undoped oxide layer and a deposited polysilicon or nitride layer.

DETAILED DESCRIPTION

Figure 1:
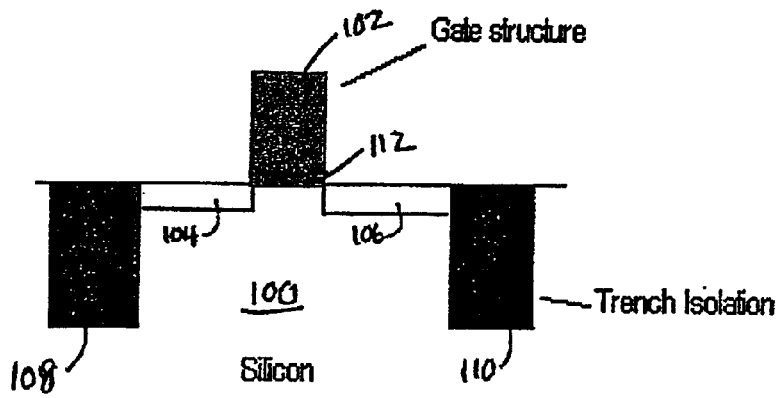
FIG. 1 illustrates one embodiment of a silicon substrate and a gate structure.

FIG. 1 illustrates one embodiment of a silicon substrate 100, doped source and drain areas 104, 106 and a gate structure 102. Spacers are formed along the sidewalls of the gate structure 102 by forming (e.g., depositing) a film. Typically, the film used to form the spacers may comprise oxide, nitride or polysilicon. The selected spacer film and the selected etch chemistry can control the spacer width.

Device performance can be improved by creating the ability to control or modify short channel effects during the manufacturing sequence. When gate lengths or widths become very small (e.g., under 200 nm), the amount of lateral diffusion of the implants in the source and drain areas 104, 106 become more significant to the gate length/width. As device dimensions shrink, minimizing contact resistance also becomes a critical issue. One technique to (a) control or modify short channel effects during the manufacturing sequence and (b) minimize contact resistance is to modulate the spacers by trimming the spacer widths.

Exemplifying methods of forming and modulating spacers are described in co-assigned U.S. patent application entitled "IMPLANT PROFILES AND ACTIVE AREA MODULATION USING SPACER ETCH TRIM TECHNIQUES" which is hereby incorporated by reference in its entirety.

In FIG. 1, a polysilicon or metal gate structure 102 may be formed utilizing conventional methods over a dielectric layer 112 on a substrate 100, which has trench isolation structures 108, 110. After the gate 102 is formed, lightly-doped source and drains implants 104, 106 may be formed, e.g., by doping, in the substrate 100.

Figure 2:
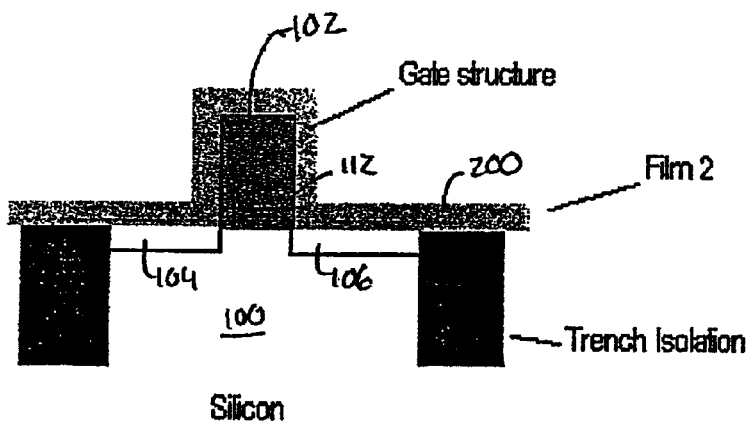
FIG. 2 shows an oxide layer that is deposited or thermally grown on top of the semiconductor substrate of FIG. 1.

FIG. 2 shows an oxide layer 200 that is deposited or thermally grown on top of the semiconductor substrate 100 and gate 102 of FIG. 1. The oxide 200 may be about 100 to about 100 Angstroms thick.

Figure 3:
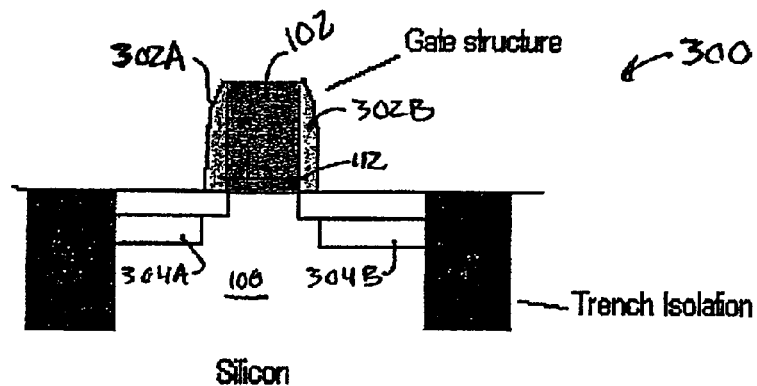
FIG. 3 shows the oxide layer of FIG. 2 etched using dry plasma etch chemistries or some other suitable technique to form spacers along the gate wall.

FIG. 3 shows the oxide layer 200 of FIG. 2 etched using dry plasma etch chemistries or some other suitable technique to form spacers 302A, 302B along the gate wall. In FIG. 3, further source and drain implants 304A, 304B may be formed, e.g., by doping, to tune the device 300 for desired performance.

Figure 4:
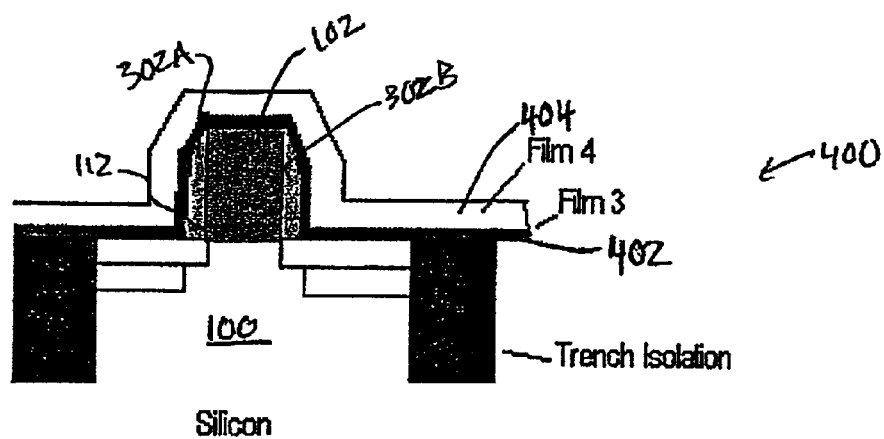
FIG. 4 shows an undoped oxide layer deposited or otherwise formed on the wafer, the gate and the spacers of FIG. 3, followed by a poly deposition layer.

FIG. 4 shows an undoped oxide layer 402 (e.g., about 50–100 A thick)(film 3) deposited or otherwise formed on the wafer 100, the gate 102 and the spacers 302A, 302B of FIG. 3, followed by a poly deposition layer 404 (e.g., about 100–1500 A thick).

Figure 5:
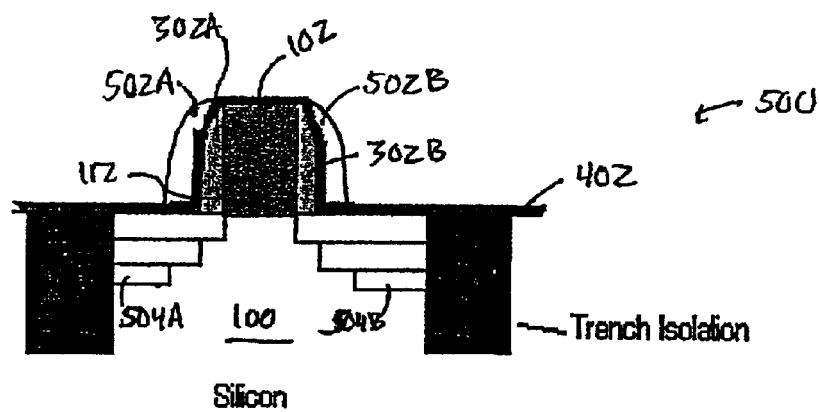
FIG. 5 shows poly spacers formed from the poly layer in FIG. 4 along the sides of the undoped oxide layer covering the oxide spacers and additional implants.

FIG. 5 shows poly spacers 502A, 502B formed from the poly layer 404 in FIG. 4 along the sides of the undoped oxide layer 402 covering the oxide spacers 302A, 302B. A poly dry etch or other suitable poly removal technique may be used to form the poly spacers 502A, 502B. A dry etch is preferred because a wet etch may be too isotropic, and no poly spacer would be formed.

The poly spacers 502A, 502B allow additional N-channel or P-channel implant areas 504A, 504B to be formed away from the gate structure 102. The source and drain implants 504A, 504B in FIG. 5 may be formed to achieve a desired device performance.

Figure 6:
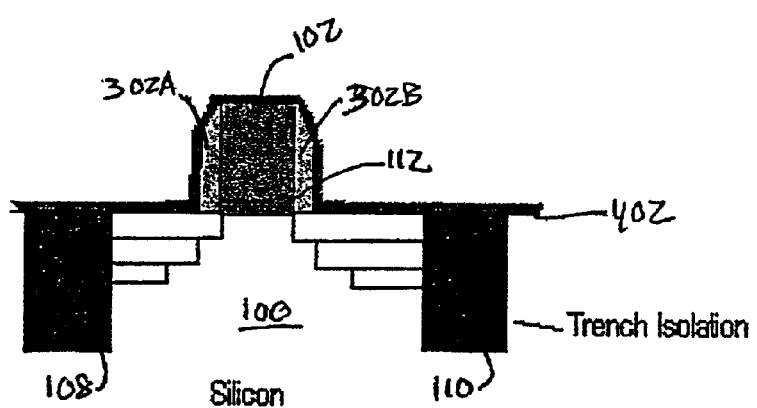
FIG. 6 shows the poly spacers of FIG. 5 completely etched by a dry plasma etcher of FIG. 13.
Figure 13:
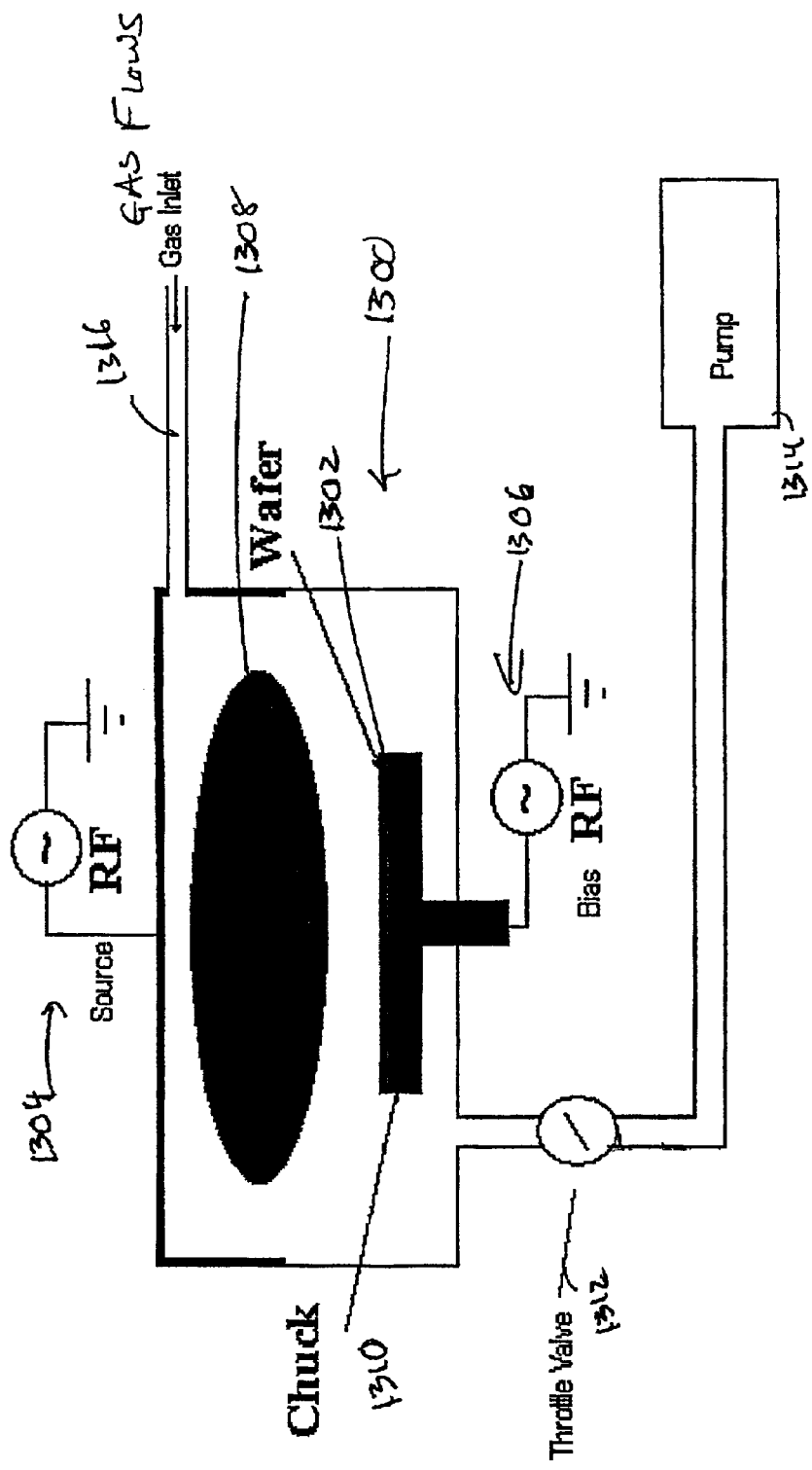
FIG. 13 illustrates a wafer in one embodiment of an etch chamber configured to perform one embodiment of an etch process in accordance with the present invention.

FIG. 6 shows the poly spacers 502A, 502B of FIG. 5 completely etched by a dry plasma etcher of FIG. 13. The reason the poly spacers 502A, 502B are removed is to allow more exposed S/D area when silicidation/salicidation is performed, which provides a lower contact resistance. The isotropic dry etch may have a poly-to-oxide selectivity of about 20-to-1 to about 100-to-1 and will stop on the undoped oxide layer 402, i.e., will not penetrate deeper than about 30 to about 50 Angstrom of the undoped oxide layer 402.

In one embodiment, (a) the dry plasma etch chemistries used to form the oxide spacers 302A, 302B in FIG. 3, (b) the poly dry etch process used to form the spacers 502A, 502B in FIG. 5, and (c) the isotropic dry plasma etch process in FIG. 6 used to etch away the spacers 502A, 502B may comprise different etch processes. The oxide spacers 302A, 302B may be etched with $CF_4/CHF_3/O_2$ at high power. The poly/nitride spacers 502A, 502B may be etched with some combination of $HBr/Cl_2/CF_4$.

Since poly etches are highly selective to oxide films, such as the undoped oxide film 402, increased poly over etching can be used to insure that substantially all of the poly is trimmed off, including the poly spacers 502A, 502B in FIG. 5. The undoped oxide layer 402 provides the "self-limiting" etch technique mentioned above.

Additional source and drain implants (not shown) may be performed if desired to achieve desired depletion profiles for N or P short channel devices.

The removal of the poly spacer 502A, 502B by dry etch, and to a lesser extent pre-clean procedures prior to salicidation formation, would now increase salicided source and drain area dimensions, which are now bounded by the spacers 302A, 302B (formed by the film 200 in FIG. 2) and the active field edges defined by the isolation structures 108, 110.

Alternative Methods

Figure 7:
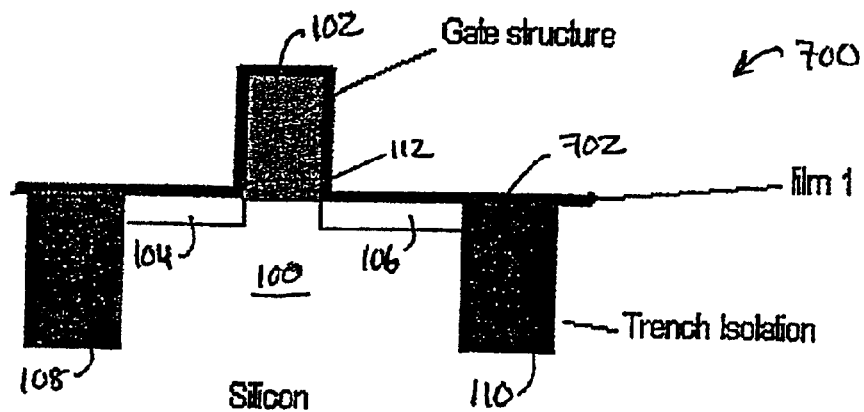
FIG. 7 shows an alternative method that deposits or otherwise forms an oxide film on a gate, isolation structures, and lightly-doped areas of FIG. 1.

FIG. 7 shows an alternative method that deposits or otherwise forms an oxide film 702 on a gate 102, isolation structures 108, 110 and lightly-doped areas 104, 106 of FIG. 1.

Figure 8:
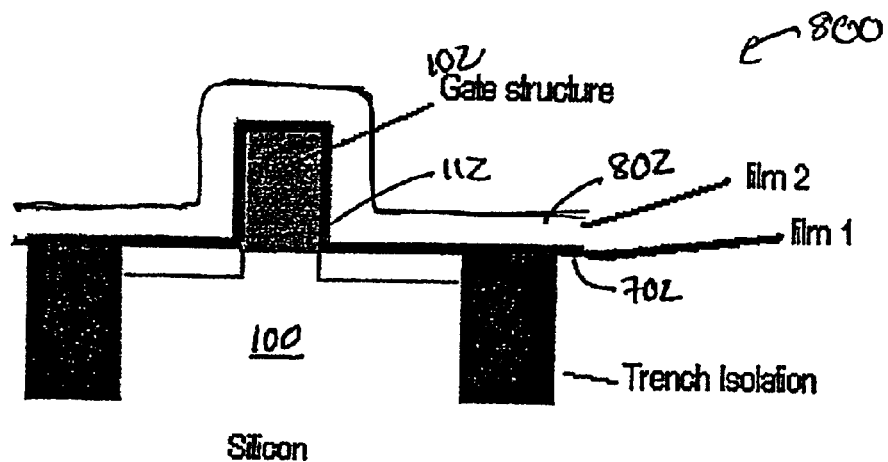
FIG. 8 shows a nitride layer that is deposited or otherwise formed on top of the oxide film of FIG. 7.

FIG. 8 shows a nitride layer 802 that is deposited or otherwise formed on top of the oxide film 702 of FIG. 7.

FIG. 9 shows the nitride layer 802 of FIG. 8 dry etched or otherwise shaped to form spacers 904A, 904B and also shows additional source and drain implants 902A, 902B, which may be formed by doping, for example, to tune the device 900 for desired performance.

Another alternative method would use a nitride layer to form a first pair of spacers and use another nitride layer to form a second pair of spacers.

FIG. 10 shows the first pair of etched spacers 904A, 904B from FIG. 9, an undoped oxide layer 1004 (film 3) and a polysilicon or nitride layer 1006 (film 4). The undoped oxide layer 1004 (film 3) is deposited or otherwise formed on top of the etched nitride spacers 904A, 904B and the oxide film 702 (film 1). The polysilicon or nitride layer 1006 (film 4) is formed on the undoped oxide layer 1004 (film 3).

Figure 11:
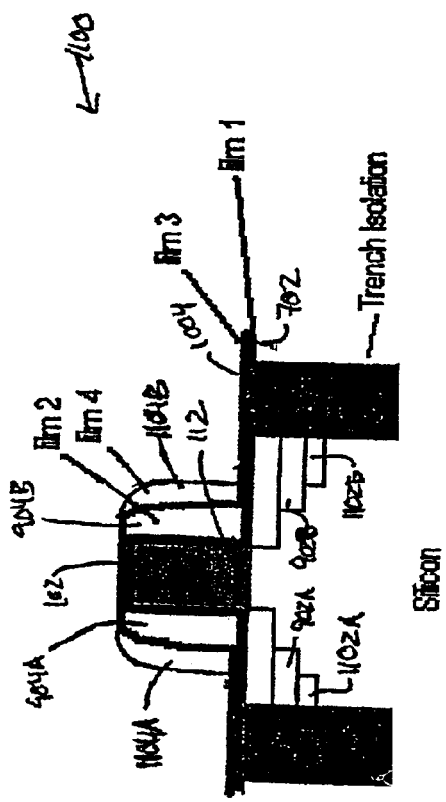
FIG. 11 shows a second pair of spacers (film 4) etched or otherwise formed from the poly or nitride layer in FIG. 10 and additional source and drain implants, which may be formed by doping, for example, to tune the device for desired performance.

FIG. 11 shows a second pair of spacers 1104A, 1104B (film 4) dry etched or otherwise formed from the poly or nitride layer 1006 in FIG. 10. FIG. 11 also shows additional source and drain implants 1102A, 1102B, which may be formed by doping, for example, to tune the device 1100 for desired performance.

Figure 12:
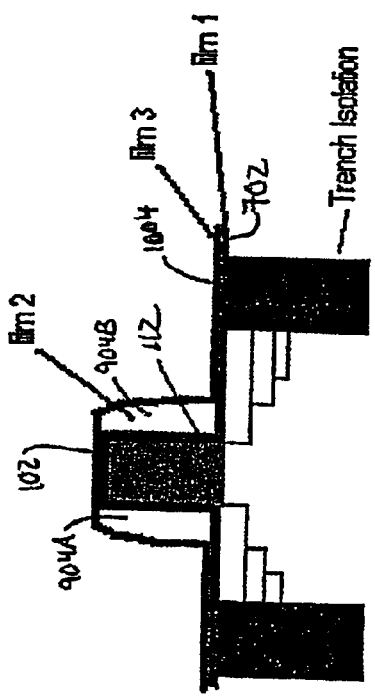
FIG. 12 shows the nitride or poly spacers of FIG. 11 completely etched.

FIG. 12 shows the nitride or poly spacers 1104A, 1104B of FIG. 11 completely dry etched, as described below, or otherwise removed. A dry etch chemistry to isotropically trim the nitride may have a selectivity of about 10:1 to about 25:1 to oxide, while poly:oxide chemistries may have selectivities of about 20:1 to fu about 100:1, which may make poly the preferred film (film 4 in the FIGS. 4 and 10) to form second spacers.

Another alternative method would use oxide for first spacers. (film 2), such as the spacers 302A, 302B in FIGS. 2 and 3, and use nitride (e.g., instead of poly) for second spacers (film 4), such as the spacers 502A, 502B in FIG. 5. In this method, an undoped oxide layer 402 is formed as in FIG. 4, and a nitride layer is deposited or formed on top of undoped oxide layer 402.

Dry Etch Process and Exemplifying Conditions

The processes described above with FIGS. 1–12 involve trimming or etching polysilicon or nitride spacers, which are formed proximate to the sidewalls of a semiconductor gate structure 102. Using wet etch processes to trim or remove a polysilicon or nitride spacer formed along the sidewalls of a gate may not be feasible because of (a) adverse effects on the dopants in the source and drain areas 104, 106 of the semiconductor device, and (b) an inherent inability of wet etch processes to control vertical and lateral etch rates.

In contrast, dry etch chemistries are more desirable because the effects on the dopant concentrations in the semiconductor can be compensated by choosing appropriate process conditions, as describe below. In addition, dry etching provides better control of the ratio of lateral-to-vertical etch rates during the spacer trim step.

To achieve the spacer trim described above, a dry etch process and exemplifying conditions in accordance with the present invention are described below. One embodiment of the dry etch process utilizes a 9400 DFM model poly etcher made by LAM Research Corporation of Fremont, Calif.

FIG. 13 illustrates a wafer 1302 in one embodiment of an etch chamber 1300 of a dry etcher configured to perform one embodiment of an etch process in accordance with the present invention. Conventionally, a dry etcher uses a "source" power source 1304 and a "bias" power source 1306 to create a plasma 1308 in "tool plasma etching" to etch a wafer 1302 on a chuck 1310. The plasma 1308 comprises free radicals and energetic ions that etch parts of the wafer 1302.

One embodiment of the dry etch process described below uses an etcher in a non-traditional method, i.e., by using substantially no bias power or low bias power. The dry etch process may also use other modified parameters, such as gas flows and various pressures.

A ratio of the source and bias power sources 1304, 1306 controls the directions of energetic ions in plasma etching, and thus determines the etched film profile. The source/bias power ratio also controls film selectivity. The application of the bias power source 1306 increases the ion energy that provides directionality, and thus enables an anisotropic etch. In one embodiment, "anisotropic etching" can be defined as etching significantly more in the vertical direction compared to the horizontal direction. Wet etching is typically "isotropic," which etches equally in the vertical and horizontal directions. Most dry plasma etches (e.g., gate, contact, trench) are considered anisotropic.

In one embodiment, the etch chamber 1300 of the 9400 DFM model etcher operates with predetermined process parameters, such as a source power 1304 from about 700 to about 800 watts, pressure (applied by a pump 1314 and controlled by a throttle valve 1312) from about 50 to about 70 milliTorr, an addition of about 70 to about 80 sccm hydrogen bromide (HBr), about 20 to about 30 sccm $CF_4$, about 30 to about 40 sccm $SF_6$, and about 70 to about 80 sccm Helium. The added gases may be applied by a gas inlet structure 1316.

Dry etching may be both physical and chemical in nature. Physical etching is done by energetic ions in the plasma 1308 and creates more vertical (anisotropic), etches. Typically, dry etching is made more physical and anisotropic. But one embodiment of the process described herein makes the dry etch more chemical and isotropic. Specifically, one process minimizes plasma ion energy by controlling the bias power source 1306, which may be set to 0 watts in one embodiment. Low bias powers 1306, such as for example 0–50 watts, result in fewer energetic ions to bombard the surface of the wafer 1302 and create a physical etch.

With low bias powers, free radicals (i.e., charged molecules, such as $SF_5$) dominate the plasma 1308. Radicals have lower energy states and are more chemical in nature than energetic ions. By tuning the plasma 1308, i.e., reducing the amount of energetic ions and increasing the amount of radicals, the plasma 1308 becomes more chemical in nature and results in a more isotropic etch.

Etching techniques with gases such as $SF_6$, which have a high ionization potential (e.g., 19.3 eV), are predominantly chemical in nature and not physical because more radicals, such as $SF_5$, are created in the plasma 1308, as opposed to F. Thus, etching techniques that are predominantly chemical in nature enhance lateral trim capabilities. With this process, excellent polysilicon-to-oxide and nitride-to-oxide selectivities can be achieved. For example, polysilicon-to-oxide selectivities may be better then 100:1, and nitride-to-oxide may be better than 20:1.

The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. A method of forming spacers proximate to a gate structure, the method comprising:

forming a first layer over a gate structure and a substrate;

etching the first layer to form a first set of spacers proximate to the gate structure;

forming a second layer over the substrate, the first set of spacers and the gate structure;

forming a third layer over the second layer;

etching the third layer to form a second set of spacers proximate to the first set of spacers; and dry etching the second set of spacers with a plasma, wherein the second layer prevents the etching of the second set of spacers from substantially affecting the first set of spacers, thereby reducing a contact resistance and allowing a plurality of implant areas to be formed away from the gate structure.

2. The method of claim 1, wherein dry etching the second set of spacers uses a dry etch chamber with a bias power configured to be less than a source power, such that free radicals in a plasma dominate the plasma in the dry etch chamber, the plasma being used to etch the second set of spacers.

3. The method of claim 2, wherein the plasma comprises radicals and energized ions.

4. The method of claim 3, wherein the pressure is controlled by a pump and a throttle valve.

5. The method of claim 1, wherein dry etching the second set of spacers uses a dry etch chamber with a source power of about 700 to about 800 watts and a bias power source of about 0 to about 50 watts.

6. The method of claim 1, wherein dry etching the second set of spacers uses a dry etch chamber with a pressure of about 50 to about 70 milliTorr.

7. The method of claim 1, wherein dry etching the second set of spacers uses one or more gases with high ionization potentials, the gases creating radicals in a plasma used to etch the second set of spaces.

8. The method of claim 1, wherein dry etching the second set of spacers uses a dry etch chamber with added gases, the gases comprising:

about 70 to about 80 sccm hydrogen bromide (HBr);

about 20 to about 30 sccm $CF_4$;

about 30 to about 40 sccm SF6; and about 70 to about 80 sccm Helium.

9. The method of claim 1, further comprising implanting dopants in the substrate on opposite sides of the gate structure to form source and drain areas before forming the first layer.

10. The method of claim 1, further comprising implanting dopants in the substrate on opposite sides of the gate structure after etching the first layer to form the first set of spacers adjacent to the gate structure and before forming a second layer over the substrate, the first set of spacers and the gate structure.

11. The method of claim 1, further comprising implanting dopants in the substrate on opposite sides of the gate structure after etching the third layer to form the second set of spacers proximate to the first set of spacers and before etching the second set of spacers.

12. The method of claim 1, further comprising forming a dielectric layer over the substrate and forming the gate structure over the dielectric layer.

13. The method of claim 1, wherein the first layer comprises an oxide material.

14. The method of claim 1, wherein the first layer comprises a nitride material.

15. The method of claim 1, further comprising forming a layer of oxide material over the gate structure and the substrate before forming the first layer.

16. The method of claim 1, wherein the first layer is about 100 to about 1000 Angstroms thick.

17. The method of claim 1, wherein the first layer is deposited.

18. The method of claim 1, wherein the first layer is thermally grown.

19. The method of claim 1, wherein the first layer is etched using dry plasma etch chemistries.

20. The method of claim 1, wherein the second layer comprises an undoped oxide material.

21. The method of claim 1, wherein the second layer is about 50 to about 100 Angstroms thick.

22. The method of claim 1, wherein the third layer comprises a polysilicon material.

23. The method of claim 1, wherein the third layer is about 100 to about 1500 Angstroms thick.

24. The method of claim 1, wherein the third layer is first etched using a polysilicon dry etch.

25. The method of claim 1, wherein the second set of spacers are etched using a dry plasma etcher, the etching having polysilicon-to-oxide selectivities of about 20-to-1 to about 100-to 1.

26. The method of claim 1, wherein the second set of spacers are etched using a dry plasma etcher, the etching will not penetrate deeper than about 30 to about 50 Angstrom of the second layer.

27. The method of claim 1, wherein the second set of spacers are completely etched.

28. The method of claim 1, wherein the third layer comprises a nitride material.

29. The method of claim 28, wherein the second set of spacers are isotropically etched using a dry plasma etcher and the isotropic etching has nitride-to-oxide selectivities of about 10-to1 about 25-to 1.

* * * * *